(12) United States Patent
Kikuchi et al.

(10) Patent No.: US 11,270,907 B2
(45) Date of Patent: Mar. 8, 2022

(54) SEMICONDUCTOR DEVICE AND METHOD FOR PRODUCING SEMICONDUCTOR DEVICE

(71) Applicant: SUMITOMO ELECTRIC INDUSTRIES, LTD., Osaka (JP)

(72) Inventors: Takehiko Kikuchi, Osaka (JP); Hideki Yagi, Osaka (JP); Nobuhiko Nishiyama, Tokyo (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/999,155

(22) Filed: Aug. 21, 2020

(65) Prior Publication Data

US 2021/0066117 A1  Mar. 4, 2021

(30) Foreign Application Priority Data

Aug. 26, 2019  (JP) .............................. JP2019-153759

(51) Int. Cl.
*H01L 21/762* (2006.01)
*H01L 29/15* (2006.01)
(Continued)

(52) U.S. Cl.
CPC .... *H01L 21/76256* (2013.01); *H01L 21/7624* (2013.01); *H01L 21/76251* (2013.01); *H01L 23/373* (2013.01); *H01L 23/3738* (2013.01); *H01L 29/151* (2013.01); *H01L 29/267* (2013.01); *H01L 2224/80097* (2013.01)

(58) Field of Classification Search
CPC ............. H01L 21/76256; H01L 29/267; H01L 21/7624; H01L 21/76251–76259; H01L 21/76297; H01L 21/84; H01L 29/151–152; H01L 23/373;
(Continued)

(56) References Cited

U.S. PATENT DOCUMENTS 9,431,793 B2 * 8/2016 Suzuki .................. H01S 5/1237
2015/0155165 A1 * 6/2015 Hata ................. H01L 21/02002
257/623

FOREIGN PATENT DOCUMENTS

JP  2015156440 A  * 8/2015
JP  2015-164148 A  9/2015

OTHER PUBLICATIONS

Takehiko KIKUCHI et al., "High Yield Chip-on-wafer Low Temperature Plasma Activated Bonding for III-V/Si Hybrid Photonic Integration," 2019 6th International Workshop on Low Temperature Bonding for 3D Int egration (LTB-3D), May 21-25, 2019.
(Continued)

*Primary Examiner* — Jose R Diaz
(74) *Attorney, Agent, or Firm* — Oliff PLC

(57) ABSTRACT

A method for producing a semiconductor device includes a step of bonding a chip to a SOI wafer, the chip being formed of a III-V group compound semiconductor and including a substrate and a first semiconductor layer; and a step of removing the substrate and the first semiconductor layer from the chip after the step of bonding. In the producing method, the first semiconductor layer has a tensile strain, and the SOI wafer and the chip are heated to a first temperature in the step of bonding, and are cooled to a second temperature lower than the first temperature after the step of bonding.

9 Claims, 7 Drawing Sheets

(51) Int. Cl.
*H01L 29/267* (2006.01)
*H01L 23/373* (2006.01)

(58) Field of Classification Search
CPC ............. H01L 23/3733; H01L 23/3738; H01L 2224/80097
See application file for complete search history.

(56) References Cited

OTHER PUBLICATIONS

Liu Bai et al., "Examination of Chip-on-Wafer Plasma Activated Bonding Technology for III-V on Si Hybrid Photonic Integrated Circuits," IEICE Technical Report, vol. 118, No. 348, OPE2018-127, p. 149-153, Nov. 29, 2018.

Liu Bai et al., "Investigation of stress dependence on bonding strength for III-V/Si chip-on-wafer by plasma activated bonding," JSAP Spring Meeting 2019, Mar. 2019.

* cited by examiner

SEMICONDUCTOR DEVICE AND METHOD FOR PRODUCING SEMICONDUCTOR DEVICE

CROSS-REFERENCE TO RELATED APPLICATION

This application is based upon and claims the benefit of priority of the prior Japanese Patent Application No. 2019-153759, filed on Aug. 26, 2019, the entire contents of which are incorporated herein by reference.

FIELD

The present disclosure relates to a semiconductor device and a method for producing the semiconductor device.

BACKGROUND

Techniques for forming a semiconductor device by bonding a compound semiconductor such as III-V group compound semiconductor to a silicon substrate containing a waveguide are known (e.g., Japanese Patent Application Publication No. 2015-164148). The silicon substrate is capable of having a large diameter such as 10 inches or more, while it is difficult to increase the diameter of the compound semiconductor wafer. To increase the diameter of the silicon substrate and reduce the consumption of the compound semiconductor wafer, small pieces (chips) are formed by cutting the compound semiconductor wafer and then bonded to the silicon substrate.

SUMMARY

A method for producing a semiconductor device includes a step of bonding a chip to a SOI (Silicon on Insulator) wafer, the chip being formed of a III-V group compound semiconductor and including a substrate and a first semiconductor layer; and a step of removing the substrate and the first semiconductor layer from the chip after the step of bonding. In the producing method, the first semiconductor layer has a tensile strain, and the SOI wafer and the chip are heated to a first temperature in the step of bonding and are cooled to a second temperature lower than the first temperature after the step of bonding.

A semiconductor device according to the present disclosure includes a SOI (Silicon on Insulator) wafer and a chip bonded to the SOI wafer, wherein the chip is formed of a III-V group compound semiconductor and includes a semiconductor layer having a tensile strain.

DESCRIPTION OF EMBODIMENTS

Figure 1A:
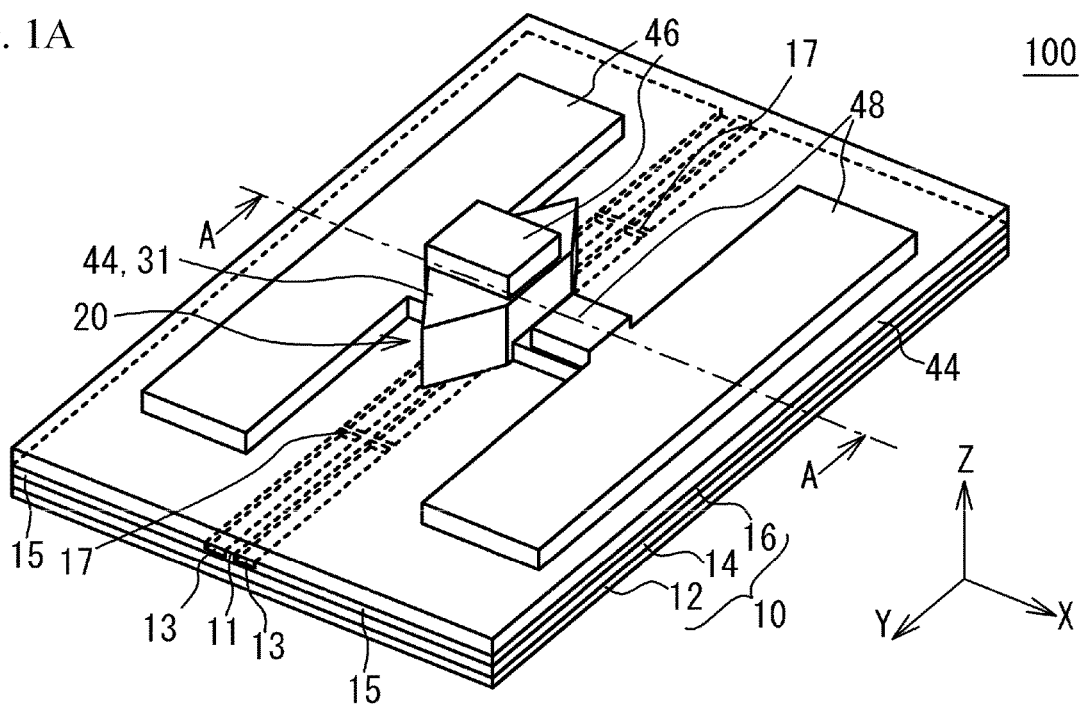
FIG. 1A is a perspective view illustrating a semiconductor device according to an embodiment of the present disclosure.

Due to a stress occurred at a bonding interface between a chip of a compound semiconductor and a silicon substrate, the bonding strength between the chip and the silicon substrate may be reduced. It is therefore an object of the present disclosure to provide a semiconductor device capable of improving the bonding strength between the chip and the silicon substrate, and a method for producing the semiconductor device.

First, embodiments of the present disclosure will be listed and described.

A method for producing a semiconductor device according to an embodiment of the present disclosure includes: (1) a step of bonding a chip to a SOI wafer, the chip being formed of a III-V group compound semiconductor and including a substrate and a first semiconductor layer; and a step of removing the substrate and the first semiconductor layer from the chip after the step of bonding. In this producing method, the first semiconductor layer has a tensile strain, and the SOI wafer and the chip are heated to a first temperature in the step of bonding, and are cooled to a second temperature lower than the first temperature after the step of bonding. The stress due to a temperature change tends to cause the chip to peel away from the SOI wafer. Another stress caused by the tensile strain in the first semiconductor layer compensates the stress caused by the temperature change. Therefore, the bonding strength between the chip and the SOI wafer is improved.

(2) The chip may include an active layer and a second semiconductor layer. The active layer may include a compressive strain, and the second semiconductor layer may include a tensile strain. In the step of removing the substrate and the first semiconductor layer, the active layer and the second semiconductor layer may remain. Since the active layer has the compressive strain, the optical properties of the semiconductor device is improved. The tensile strain in the second semiconductor layer compensates the compressive strain in the active layer. Therefore, since an entire strain remaining in the chip is reduced, and stresses in the chip are reduced.

(3) The substrate of the chip may include an indium phosphide. Since a thermal expansion coefficient of indium phosphide is larger than that of silicon, a stress occurs due to a temperature change. Since the stress caused by the tensile strain in the first semiconductor layer compensates for the stress caused by the temperature change, the bonding strength between the chip and the SOI wafer is improved.

(4) A thickness of the substrate may be 100 µm or more. When the substrate is thick, a large stress is generated due to a temperature change. Since the stress caused by the tensile strain of the first semiconductor layer compensates the stress due to the temperature change, the bonding strength between the chip and the SOI wafer is improved.

(5) The first temperature may be 100° C. or higher, and the second temperature may be 50° C. or less. A stress is generated by a temperature change. Since the stress caused by the tensile strain in the first semiconductor layer compensates for the stress caused by the temperature change, the bonding strength between the chip and the SOI wafer is improved.

(6) The step of removing the substrate and the first semiconductor layer includes a step of etching substrate, and the first semiconductor layer may be an etching stop layer. Etching to other layers of the chip is suppressed because the etching is stopped at the etching stop layer.

(7) A semiconductor device includes a SOI wafer and a chip bonded to the SOI wafer. The chip is formed of III-V group compound semiconductors and includes a semiconductor layer having a tensile strain.

(8) The chip further includes an active layer, and the active layer may have a compressive strain. Since the tensile strain in the semiconductor layer compensates the compressive strain in the active layer, the strain remaining in the chip is reduced, and the stress is reduced.

(9) A sum of a product of a thickness and the strain of the active layer and a product of a thickness and the strain of the semiconductor layer may be −0.5%·nm or more and 0.5%·nm or less. Stresses in the chip are reduced because the strains remaining in the chip is small.

(10) The semiconductor layer in the chip may be at least one of a superlattice layer forming a bonding interface with the SOI wafer and a contact layer forming a surface of the chip. Since the tensile strain in the semiconductor layer compensates for the compressive strain in the active layer, the strain remaining in the chip for is reduced, and the stress is reduced.

Figure 1B:
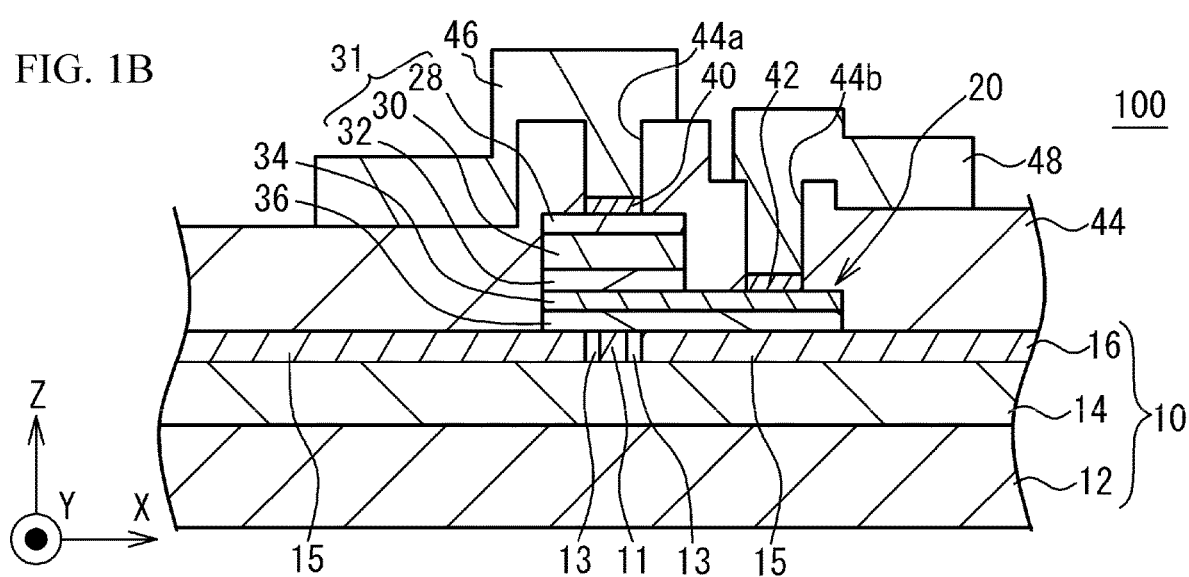
FIG. 1B is a sectional view illustrating the semiconductor device.

First Embodiment (Semiconductor device) FIG. 1A is a perspective view illustrating a semiconductor device 100 according to the first embodiment. FIG. 1B is a cross-sectional view of the semiconductor device 100 along line A-A of FIG. 1A. As illustrated in FIG. 1A and FIG. 1B, the semiconductor device 100 is a hybrid semiconductor device having a SOI wafer 10 and a chip 20 (small piece).

The SOI wafer 10 is a silicon on insulator (SOI) substrate including a silicon (Si) substrate 12, a silicon dioxide ($SiO_2$) layer 14, and a Si layer 16 which are sequentially stacked in the Z-axis direction. The thickness of the Si substrate 12 is, for example, 550 µm. The thickness of the $SiO_2$ layers 14 is, for example, 3 µm or more and 4 µm or less. The thickness of the Si layer 16 is, for example, 0.2 µm or more and 0.5 µm or less. The length of the SOI wafer 10 used in the semiconductor device 100 is, for example, 4 mm in the X-axis direction.

The Si-layer 16 is provided with walls 17, a waveguide mesa 11, grooves 13 and terraces 15. The waveguide mesa 11 extends in the Y-axis direction. The groove 13 is provided each on both sides of the waveguide mesa 11 in the X-axis direction, and each of the groove 13 extends in the Y-axis direction. The waveguide mesa 11 and the pair of the grooves 13 are sandwiched by a pair of the terraces 15 in the X-axis direction. As illustrated in FIG. 1A, the wall 17 is provided so as to traverse the groove 13 in the X-axis direction. One end of the wall 17 is connected to the waveguide mesa 11 and the other end of the wall 17 is connected to the terrace 15. The groove 13 is, for example, 3 µm wide and the wall 17 is, for example, 1 µm thick. The height of the waveguide mesa 11 is equal to the height of the terrace 15 and the height of the wall 17.

As illustrated in FIG. 1A and FIG. 1B, the chip 20 is a semiconductor chip formed of III-V group compound semiconductors and is bonded to a surface of the Si layer 16 of the SOI wafer 10. The length of one side of the chip 20 is, for example, 2 mm. As illustrated in FIG. 1B, the chip 20 includes a superlattice layer 36, a contact layer 34, an active layer 32, a cladding layer 30, and a contact layer 28, which are sequentially stacked in the Z-axis positive direction from the Si layer 16 side. The superlattice layer 36 of the chip 20 and the Si layer 16 of the SOI wafer 10 form a bonding interface between the chip 20 and the SOI wafer 10. In the chip 20, since the superlattice layer 36 forms the bonding interface, lattice defects is less likely to occur in the active layer 32.

The superlattice layer 36, the contact layer 34, the active layers 32, the cladding layer 30, and the contact layer 28 are formed of compound semiconductors such as III-V group compound semiconductors. The active layer 32 has, for example, a multi quantum well structure (MQW), and has an optical gain and a compressive strain. Since a well layer of the active layer 32 has a compressive strain, as compared with the case without the compressive strain in the well layer, optical properties are improved. The cladding layer 30 and the contact layers 34 and 28 have no strain. The superlattice layer 36 has a tensile strain.

Strain is expressed as the percentage of the change in lattice constant relative to lattice constant without strain. Tensile strain is a strain that generates a stress in the direction (Z-axis negative direction) pressing an end portion of the chip 20 toward the SOI wafer 10 in FIG. 1B. Compressive strain is a strain that generates a stress in a direction (Z-axis positive direction) pulling the end portion of the chip 20 away from the SOI wafer 10. A strain amount of a layer in the present embodiment is a product of a thickness of the layer and a strain in the layer. The total (sum) of strain amounts in each layer of the chip 20 illustrated in FIG. 1B is, for example, −0.5%·nm or more and +0.5%·nm or less. The semiconductor layers included in the chip 20 will be described later in detail.

As illustrated in FIG. 1B, the active layers 32, the cladding layer 30 and the contact layer 28 form a mesa 31. The superlattice layer 36 and the contact layer 34 extend outward from the mesa 31 in the X-axis positive direction. As illustrated in FIG. 1A, the mesa 31 has a tapered shape tapering along the Y-axis positive and negative directions. The mesa 31 is located above the waveguide mesa 11, the groove 13 and the terrace 15. A tip of the tapered mesa 31 is located above the waveguide mesa 11. The mesa 31 faces the walls 17 each disposed in the Y-axis positive direction side and the Y-axis negative direction side.

An insulating layer 44 covers a top surface of the SOI wafer 10, a top surface of the contact layer 34, and side surfaces and a top surface of the mesa 31. The insulating layer 44 is formed of silicon dioxide ($SiO_2$) having a thickness of 1 µm, for example. The insulating layer 44 has an opening 44a on the mesa 31. The insulating layer 44 has an opening 44b on the contact layer 34 at the outside of the mesa 31.

An electrode 40 is provided on a top surface of the contact layer 28 inside the opening 44a. A wiring layer 46 is provided over a top surface of the electrode 40 to a top surface of the insulating layer 44. An electrode 42 is provided on the top surface of the contact layer 34 inside the opening 44b. A wiring layer 48 is provided over a top surface of the electrode 42 to the top surface of the insulating layer 44. The electrode 40 is a p-type electrode containing metals such as titanium (Ti), platinum (Pt), and gold (Au). The electrode 42 is an n-type electrode containing metals such as Au, germanium (Ge), and nickel (Ni). The wiring layers 46 and 48 are formed of a metal such as Au and have a thickness of 2 µm, for example, and serve as pads.

By applying a voltage to the wiring layers 46 and 48 to inject carriers into the active layer 32, the active layer 32 emits light. The mesa 31 of the chip 20 and the waveguide mesa 11 of the SOI wafer 10 are in the state of an evanescent light coupling. The light enters the waveguide mesa 11 from the tip of the mesa 31 and propagates through the waveguide mesa 11. The SOI wafer 10 may be provided with a light-reflecting structure having a wavelength selectivity formed of a ring resonator, a distributed Bragg reflector (DBR) or the like.

Figure 3:
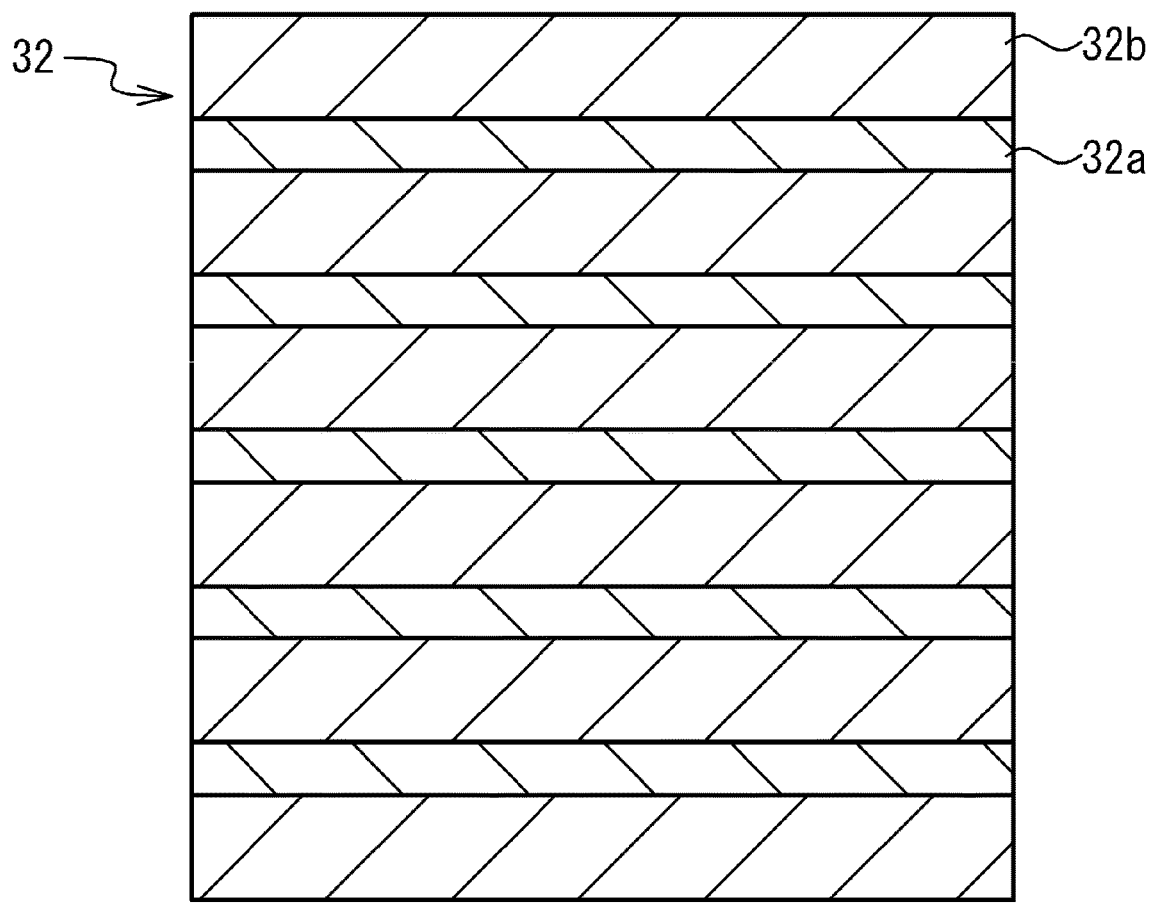
FIG. 3 is a cross-sectional view illustrating an active layer.
Figure 4:
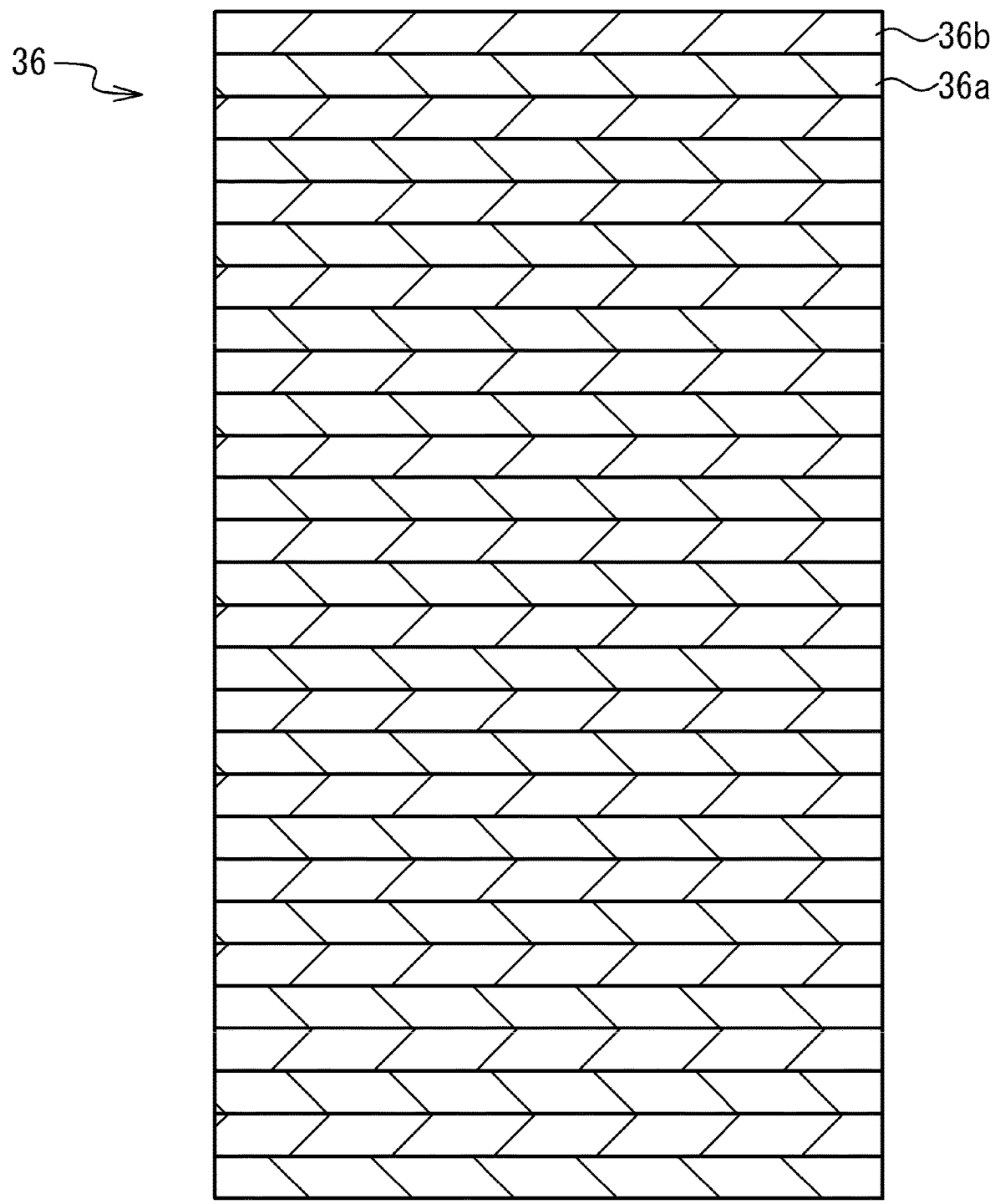
FIG. 4 is a cross-sectional view illustrating a superlattice layer.
Figure 5A:
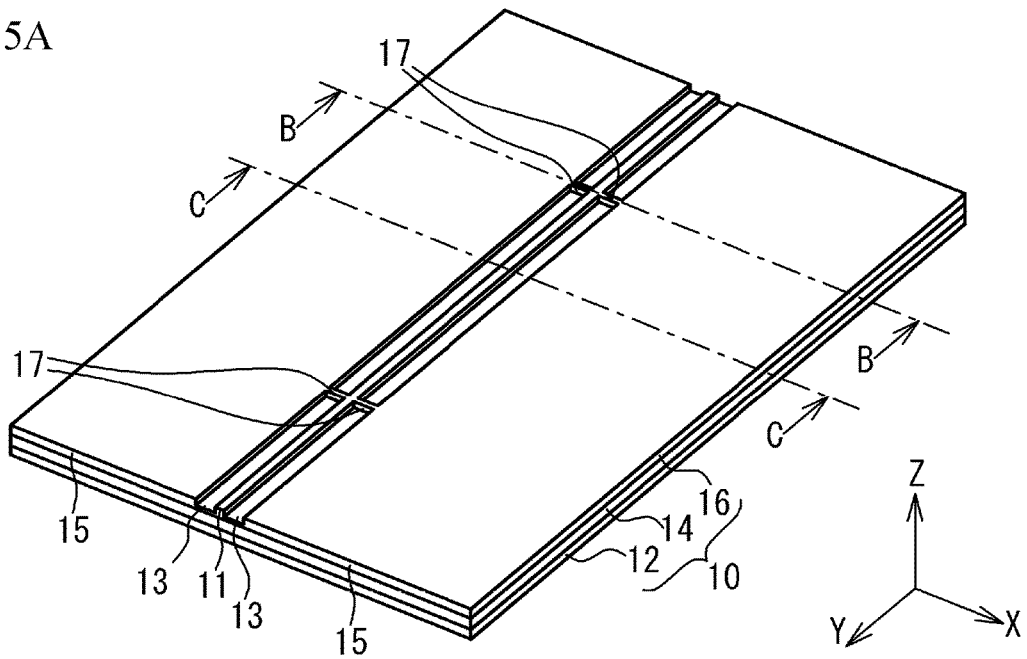
FIG. 5A is a perspective view illustrating a method for producing a semiconductor device.

(Producing Method) FIG. 2A, FIG. 5B, FIG. 5C, FIG. 6B and FIG. 7B are cross-sectional views illustrating a method for producing the semiconductor device 100. FIG. 2B is a plan view illustrating the method for producing the semiconductor device 100. FIG. 5A, FIG. 6A and FIG. 7A are perspective views illustrating the method for producing the semiconductor device 100. FIG. 3 is a cross-sectional view illustrating the active layer 32. FIG. 4 is a cross-sectional view illustrating the superlattice layer 36.

Figure 2A:
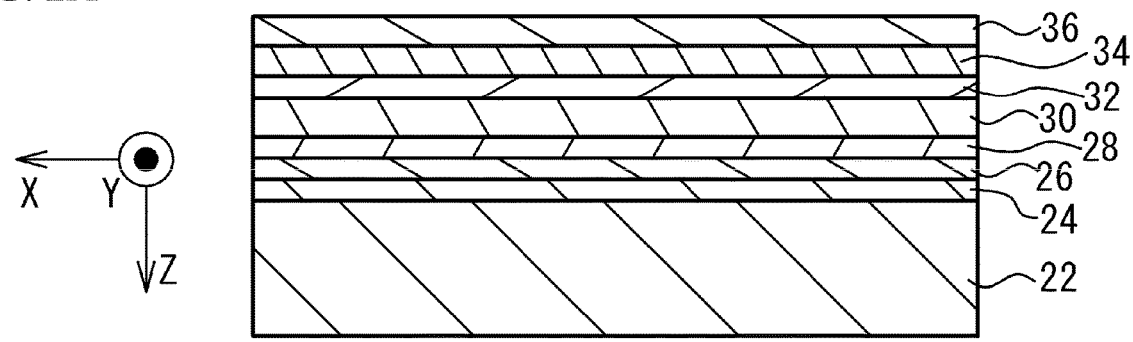
FIG. 2A is a cross-sectional view illustrating a method for producing a semiconductor device.
Figure 2B:
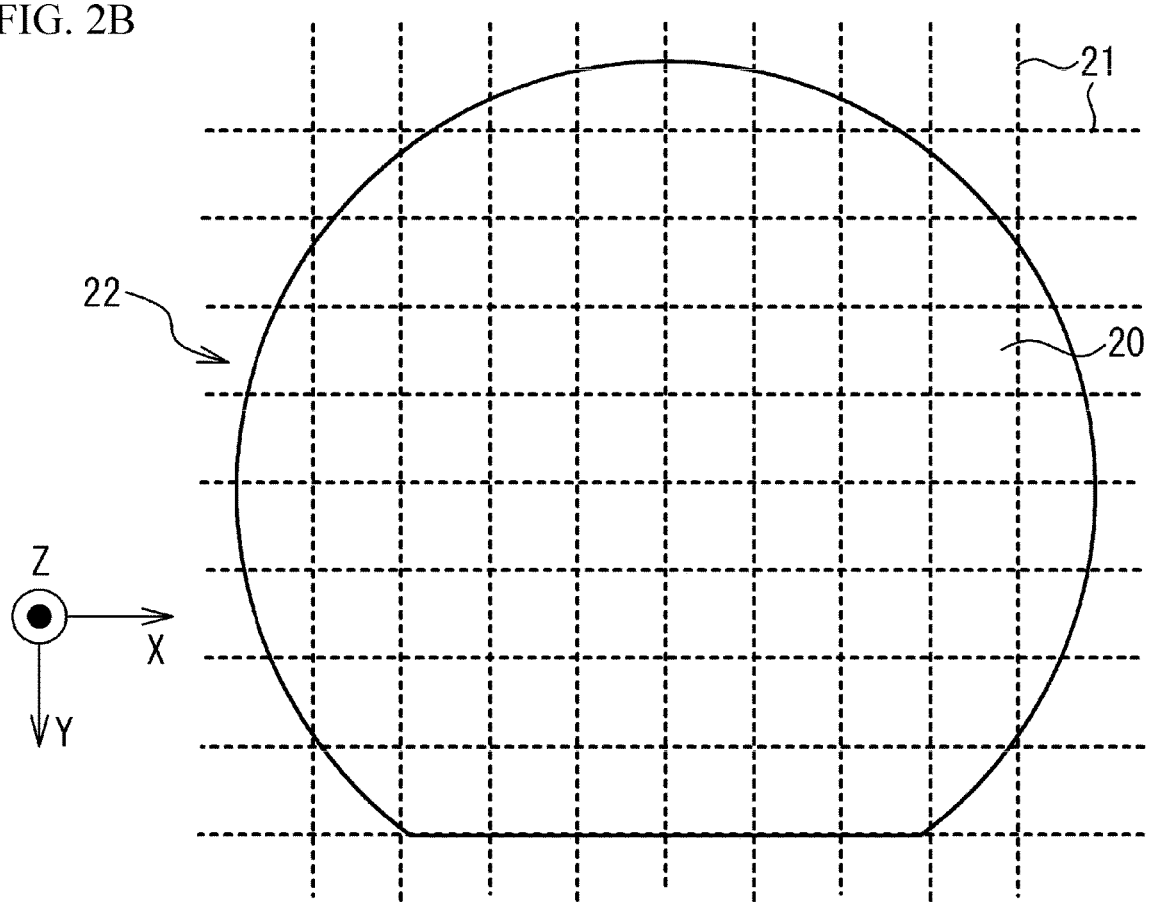
FIG. 2B is a plan view illustrating a method for producing a semiconductor device.

FIG. 2A and FIG. 2B illustrate a method for producing the chip 20. As illustrated in FIG. 2B, a substrate 22 is, for example, a 50 mm-diameter wafer. FIG. 2A is upside down from FIG. 1B. The upper side in FIG. 2A is the Z-axis negative side, and the lower side is the Z-axis positive side. As illustrated in FIG. 2A, etching stop layers 24 and 26, the contact layer 28, the cladding layer 30, the active layer 32, the contact layer 34, and the superlattice layer 36 are sequentially grown on the substrate 22 in the Z-axis negative direction in this order using Metal Organic Vapor Phase Epitaxy (MOVPE), Molecular Beam Epitaxy (MBE) or the like. These layers may be collectively referred to as a compound semiconductor layer. For example, strain is applied to the compound semiconductor layer by adjusting the flow rate of the raw material gases in the MOVPE method.

After growing the compound semiconductor layer, a plurality of the chips 20 are formed by cutting the substrate 22 along scribe lines 21 illustrated by dotted lines in FIG. 2B. The chip 20 is rectangular and includes the substrate 22 and the compound semiconductor layer. The thickness of the chip 20 is 350 µm, and the length of one side of the chip 20 is 2 mm, for example.

Table 1 shows the layered structure of the chip 20. The thickness is defined as the thickness in the Z-axis direction. Strain having a positive value represents a compressive strain, while strain having a negative value represents a tensile strain. The compressive strain is a strain in which the compound semiconductor layer is compressed by the substrate 22 along the X-Y plane. When the substrate 22 is at the lower side as illustrated in FIG. 2A, the compressive strain acts as a stress in the Z-axis positive direction on the end portion of the chip 20 so as to have the chip 20 a convex shape toward the Z-axis negative direction. The tensile strain is a strain in which the compound semiconductor layer is stretched by the substrate 22 along the XY-plane. In FIG. 2A, the tensile strain acts as a stress in the Z-axis negative direction on the end portion of the chip 20 so as to have the chip 20 a concave shape. The strain amount is the product of the thickness and the strain of the compound semiconductor layer, representing the quantity of strain in the entire compound semiconductor layer.

TABLE 1

| Layer | Material | Thickness | Strain [%] | Strain amount [%·nm] |
|---|---|---|---|---|
| Substrate 22 | InP | 350 µm | 0 | 0 |
| Etching stop layer 24 | i-GaInAs | 300 nm | −0.3 | −90 |
| Etching stop layer 26 | i-InP | 100 nm | 0 | 0 |
| Contact layer 28 | p-GaInAs | 100 nm | 0 | 0 |
| Cladding layer 30 | p-InP | 1800 nm | 0 | 0 |
| Active layer 32 | GaInAsP | well layer 32a: 5 nm × 5 | +1.0 | 13 |
|  |  | barrier layer 32b: 10 nm × 6 | −0.2 |  |
| Contact layer 34 | n-InP | 200 nm | 0 | 0 |
| Superlattice layer 36 | InP | 6 nm × 14 | 0 | 0 |
|  | GaInAsP | 7 nm × 14 | −0.13 | −12.74 |

As shown in Table 1, the substrate 22 is, for example, an indium phosphide (InP) substrate having a thickness of 350 and has no strain. The etching stop layer 24 (first semiconductor layer) is, for example, a non-doped gallium indium arsenide (i-GaInAs) layer having a thickness of 300 nm, and has a tensile strain of −0.3%. The strain amount of the etching stop layer 24 is −90%·nm. The etching stop layer 26 is, for example, an i-InP layer having a thickness of 100 nm, and has no strain. The contact layer 28 is, for example, a p-type GaInAs (p-GaInAs) layer having a thickness of 100 nm, and has no strain. The cladding layer 30 is, for example, a p-InP layer having a thickness of 1800 nm, and has no strain.

As indicated in Table 1 and FIG. 3, the active layer 32 has the multi quantum well structure including, for example, five well layers 32a and six barrier layers 32b. The well layer 32a and the barrier layer 32b are alternately stacked one by one. Each of the well layer 32a is, for example, a 5 nm-thick GaInAsP layer and has 1.0% compressive strain. Each of the barrier layer 32b is, for example, a 10 nm-thick GaInAsP layer and has a tensile strain of −0.2%. The total thickness of the active layer 32 is 85 nm, and the strain amount of the active layer 32 is 13%·nm.

The contact layer 34 is, for example, an n-InP layer having a thickness of 200 nm and has no strain. As indicated in Table 1 and FIG. 4, the superlattice layer 36 (second semiconductor layer) includes, for example, fourteen InP layers 36a and fourteen GaInAsP layers 36b. The InP layer 36a and the GaInAsP layer 36b are alternately stacked one by one. Each of the InP layer 36a has a thickness of 6 nm and has no strain. Each of the GaInAsP layers 36b is 7 nm and has a tensile strain of −0.13%. The total thickness of the superlattice layer 36 is 182 nm and the strain amount of the superlattice layer 36 is −12.74%·nm.

Entire strain of the chip 20 illustrated in FIG. 2A is a tensile strain, and the maximum strain amount among the layers is about −90%·nm. Due to this strain, the end portion of the chip 20 is displaced in the Z-axis negative direction, while a center portion is displaced in the Z-axis positive direction. A warp amount of the chip 20, that is, the distance between the center portion of the chip 20 and the end portion of the chip 20 in the Z-axis direction is 10 µm, for example.

Figure 5B:
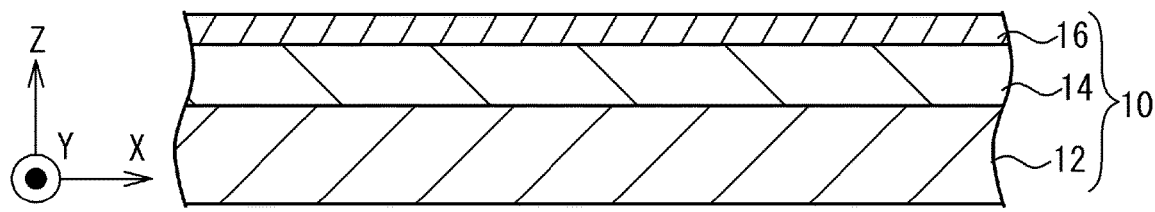
FIG. 5B and FIG. 5C are cross-sectional views illustrating a method for producing a semiconductor device.
Figure 5C:
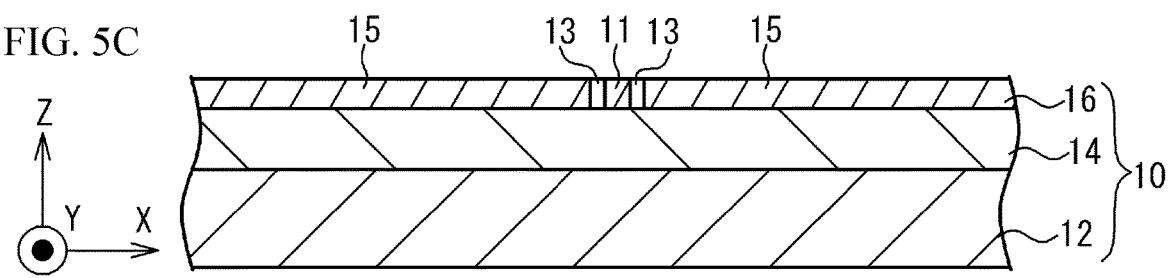
Figure 6A:
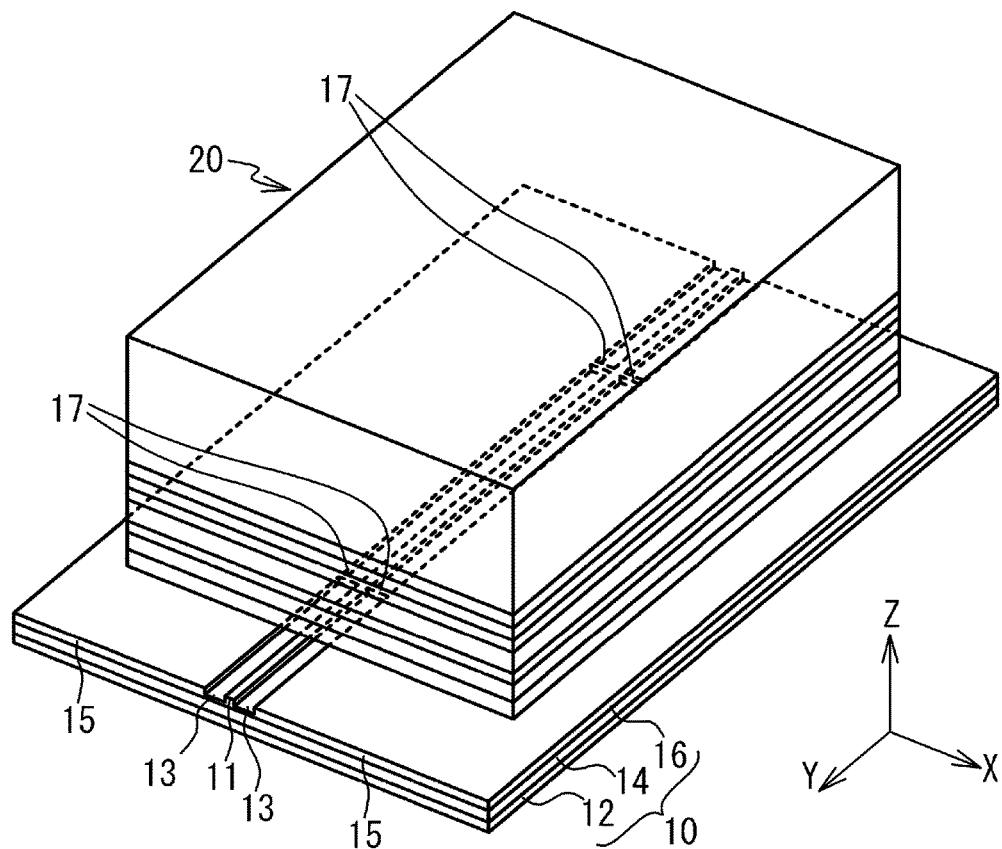
FIG. 6A is a perspective view illustrating a method for producing a semiconductor device.

FIG. 5A to FIG. 5C illustrate the steps subjected to the SOI wafer 10. FIG. 5B illustrates a cross-section along a line B-B of FIG. 5A. FIG. 5C illustrates a cross-section along a line C-C of FIG. 5A. The SOI wafer 10 is, for example, an 8-inch wafer, and the waveguide mesa 11, the grooves 13, the terraces 15 and the walls 17 are formed for each part to be formed in the semiconductor device 100. As illustrated in FIG. 5A and FIG. 5C, for example, by dry etching, the grooves 13 are formed in the Si layer 16 of the SOI wafer 10. In the Si layer 16, portions that are not subjected to dry etching become the waveguide mesa 11, the terraces 15 and the walls 17. In the Si layer 16, the portion sandwiched between a pair of the grooves 13 in the X-axis direction is formed into the waveguide mesa 11. In the Si layer 16, the outer portion of the grooves 13 in the X-axis direction is formed into the terraces 15. At least two of the walls 17 are formed in a single groove 13.

Figure 6B:
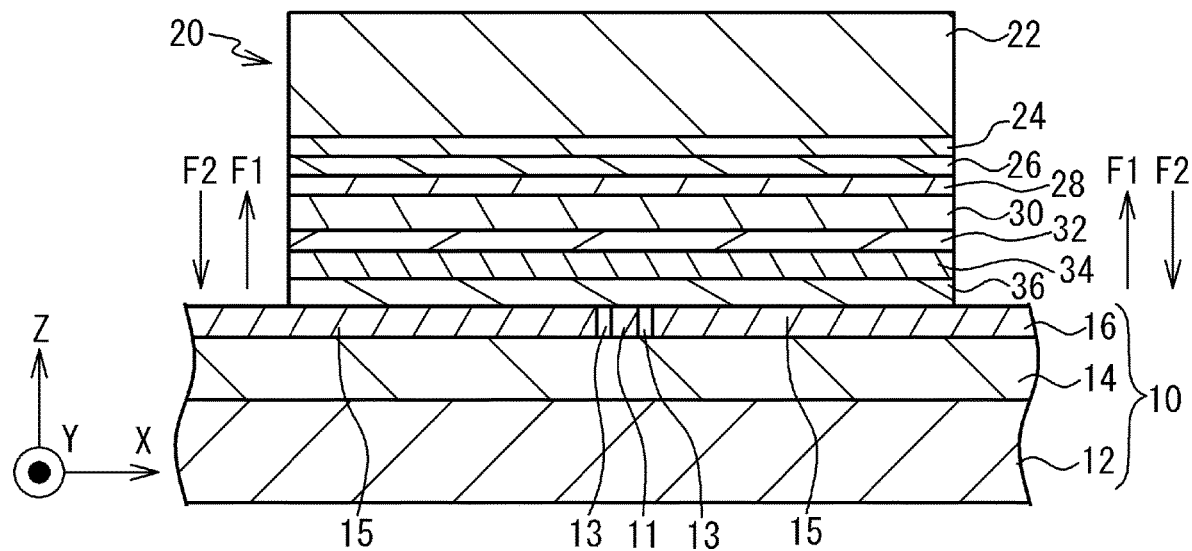
FIG. 6B is a cross-sectional view illustrating a method for producing a semiconductor device.
Figure 7A:
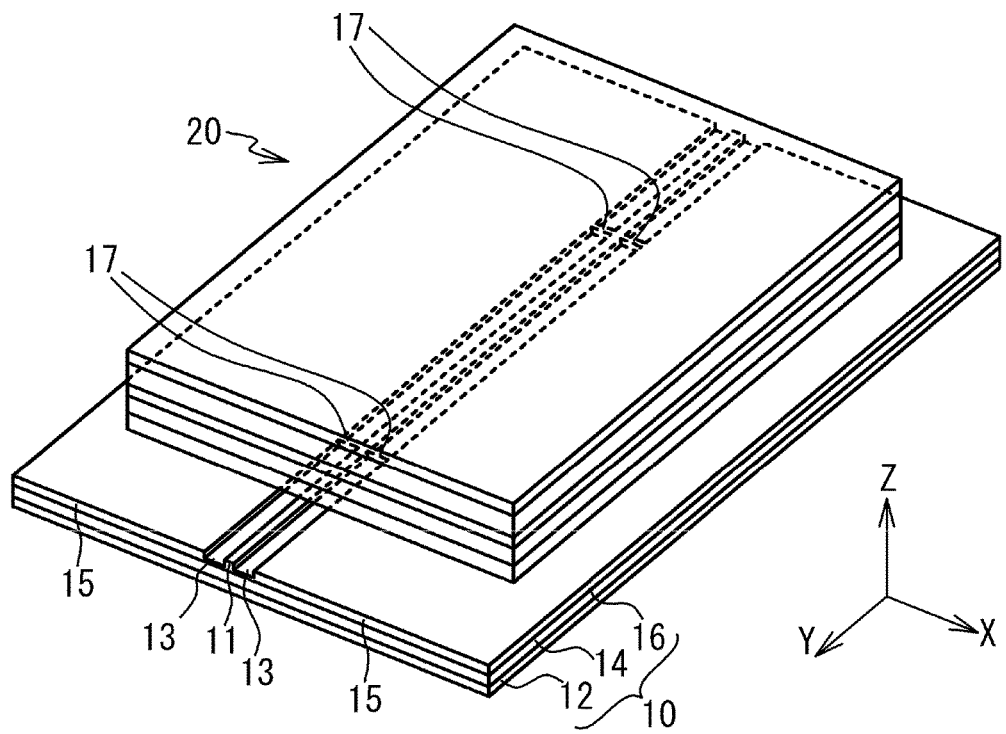
FIG. 7A is a perspective view illustrating a method for producing a semiconductor device.

FIG. 6A and FIG. 6B illustrate a state in which the chip 20 and the SOI wafer 10 are bonded to each other. The surface of the SOI wafer 10 and the surface of the superlattice layer 36 of the chip 20 illustrated in FIG. 2A are irradiated with $N_2$ plasma to be activated. The superlattice layer 36 of the chip 20 is contacted with the Si layer 16 of the SOI wafer 10. The SOI wafer 10 and the chip 20 are pressed under a load of $1 \times 10^{-4}$ Pa, for example, for 2 hours, and heated from room temperature to 150° C. (first temperature), for example, to bond the chip 20 to the SOI wafer 10. After bonding, the SOI wafer 10 and the chips 20 are cooled to room temperature (second temperature) of, for example, about 25° C. Without contacting the chip 20 with the SOI wafer 10, an insulating layer may be interposed between the chip 20 and the SOI wafer 10.

A thermal expansion coefficient of the SOI wafer 10 differs from a thermal expansion coefficient of the chip 20. The substrate 22, which accounts for more than 90% of the thickness of the chip 20, is formed of InP. The thermal expansion coefficient of InP is larger than the thermal expansion coefficient of Si constituting the SOI wafer 10. Due to a temperature change of 100° C. or higher in the bonding step, a tensile stress (stress F1) is generated in the chip 20. The stress F1 acts in the Z-axis positive direction with respect to the end portion of the chip 20.

The active layer 32 of the chip 20 has a compressive strain, and the superlattice layer 36 and the etching stop layer 24 have a tensile strain. The tensile strain of the superlattice layer 36 compensates for the compressive strain of the active layer 32, and the strain amount of the etching stop layer 24 is −90%·nm, which is larger than the strain amounts of the other layers in the chip 20. Therefore as a whole, the chip 20 has a tensile strain. In the chip 20, a stress F2 is generated by the tensile strain. The stress F2 acts in the Z-axis negative direction with respect to the end portion of the chip 20, pressing the chip 20 toward the SOI wafer 10.

The stress F2 compensates for the stress F1. The stress F1 and the stress F2 cancel with each other, resulting in the reduction of the stress acting on the chip 20 as a whole. As a result, the chip 20 is hardly peeled off the SOI wafer 10, and the bonding strength between the chip 20 and the SOI wafer 10 is improved.

Figure 7B:
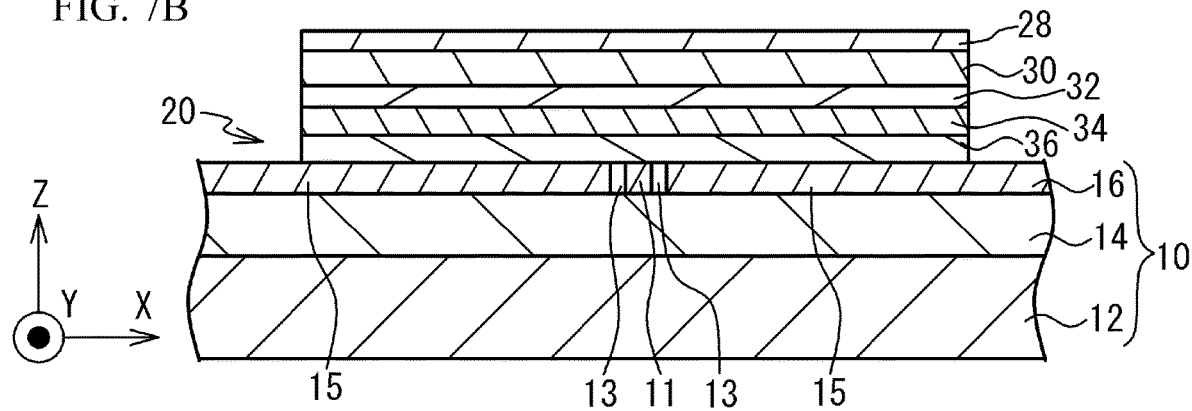
FIG. 7B is a cross-sectional view illustrating a method for producing a semiconductor device.

After bonding the chip 20 to the SOI wafer 10, a back surface of the chip 20 which is not bonded to the SOI wafer 10 is polished so as to thin the substrate 22. After the polishing, the substrate 22 is removed by wet etching using hydrochloric acid or the like as an etchant, for example. The wet etching is stopped at the etching stop layer 24. The etching stop layers 24 and 26 are then removed by another wet etching. As illustrated in FIG. 7A and FIG. 7B, the contact layer 28 is exposed. The active layer 32 has the compressive strain and the superlattice layer 36 has the tensile strain. Since the tensile strain of the superlattice layer 36 compensates for the compressive strain of the active layer 32, the strain amount of the chip 20 is reduced after removing the substrate 22 and the etching stop layers 24 and 26.

The mesa 31 is formed by etching. The insulating layer 44 is formed with a plasma CVD method or the like. The electrodes 40 and 42 and wiring layers 46 and 48 are formed by vapor deposition or the like. The SOI wafer 10 is cut along scribe lines. The semiconductor device 100 illustrated in FIG. 1A and FIG. 1B is formed in the above steps.

According to the first embodiment, during bonding of the chip 20 to the SOI wafer 10, the chip 20 and the SOI wafer 10 are heated to the high temperature and subsequently cooled to room temperature. Due to the difference in thermal expansion coefficient between the SOI wafer 10 and the chip 20 formed of III-V group compound semiconductors, the stress F1 is generated in the chip 20. The etching stop layer 24 of the chip 20 has the tensile strain. The stress F2 due to the tensile strain is inherent in the chip 20. The direction of the stress F2 is opposite to the direction of the stress F1, and thus the stress F2 compensates for the stress F1. Therefore, since the stress remaining in the chip 20 is reduced as a whole, the bonding strength between the chip 20 and the SOI wafer 10 is improved, and the peeling of the chip 20 from the SOI wafer 10 is suppressed.

As illustrated in FIG. 7A and FIG. 7B, the substrate 22 and the etching stop layers 24 and 26 of the chip 20 are removed, leaving the layers including the contact layer 28 through the superlattice layer 36. If a strain remains in the chip 20 after removing the substrate 22 and the etching stop layers 24 and 26, a stress in the horizontal direction (along the XY plane) is generated to release this strain. The active layer 32 or the like may be damaged by the stress, and the reliability of the semiconductor device 100 may be lowered.

According to the first embodiment, in the chip 20 of the semiconductor device 100 illustrated in FIG. 1B, the active layer 32 has the compressive strain and the superlattice layer 36 has the tensile strain. The tensile strain of the superlattice layer 36 compensates for the compressive strain of the active layer 32. The strain amount of the chip 20 illustrated in FIG. 1B is about −0.3%·nm, which is smaller than the strain amount prior to removing the substrate 22. Therefore, the stress caused by the strain is suppressed and the reliability of the semiconductor device 100 is improved. In order to suppress the stress, it is preferable that the strain amount remaining in the chip 20 is −5%·nm or more and 5%·nm or less. Further, since the well layer 32a of the active layer 32 has a compressive strain, the optical properties of the semiconductor device 100 are improved.

The substrate 22 of the chip 20 includes InP. The substrate 22 is a semiconductor substrate in which the entire substrate is formed of InP. The thermal expansion coefficient of InP is larger than the thermal expansion coefficient of Si forming the SOI wafer 10. The temperature during the bonding is 100° C. or more, and the temperature is 150° C., for example. After the bonding, the temperature of the chip 20 bonded to the SOI wafer 10 is 50° C. or less, for example, the temperature is 25° C. Therefore, the stress F1 is generated in the chip 20 due to the temperature change of 50° C. or more. The thicker the substrate 22 is, the greater the stress F1 is. The thickness of the substrate 22 is 100 μm or more, for example, 350 The stress F1 is, for example, 100 MPa or more. According to the first embodiment, the stress F2 caused by the tensile strain of the etching stop layer 24 of the chip 20 acts on the chip 20. This improves the bonding strength of the chip 20 to the SOI wafer 10.

The substrate 22 is removed by polishing and wet etching. The wet etching is stopped at the etching stop layer 24, and the damage is less likely to occur in the other layers in the chip 20. The etching stop layer 24 preferably has such an etch selectivity that the substrate 22 can be etched with high selectivity with respect to the etching stop layer 24 and is formed of, for example, GaInAs. Further, since the etching stop layer 24 has the tensile strain, the stress F2 is generated and compensates for the stress F1 due to the temperature change.

Second Embodiment

A semiconductor device according to the second embodiment is a semiconductor device obtained by bonding the SOI wafer 10 to the chip 20 similarly to the semiconductor device illustrated in FIG. 1A and FIG. 1B. A producing method is the same as the producing method illustrated in FIG. 2A to FIG. 7B. Descriptions of the same components as those of the first embodiment will be omitted. The entire strain of the chip 20 of the second embodiment differs from that of the first embodiment. Table 2 shows the layered structure of the chip 20.

TABLE 2

| Layer | Material | Thickness | Strain [%] | Strain amount [%·nm] |
|---|---|---|---|---|
| Substrate 22 | InP | 350 μm | 0 | 0 |
| Etching stop layer 24 | i-GaInAs | 300 nm | −0.3 | −90 |
| Etching stop layer 26 | i-InP | 100 nm | 0 | 0 |
| Contact layer 28 | p-GaInAs | 100 nm | −0.13 | −13 |
| Cladding layer 30 | p-InP | 1800 nm | 0 | 0 |
| Active layer 32 | GaInAsP | well layer 32a: 5 nm × 5 | +1.0 | 13 |
|  |  | barrier layer 32b: 10 nm × 6 | −0.2 |  |
| Contact layer 34 | n-InP | 200 nm | 0 | 0 |
| Superlattice layer 36 | InP | 6 nm × 14 | 0 | 0 |
|  | GaInAsP | 7 nm × 14 | 0 | 0 |

As shown in Table 2, the strain amount of the active layer 32 is 13%·nm. The contact layer 28 (second semiconductor layer) has a tensile strain of −0.13%, and the thickness of the contact layer 28 is 100 nm. The strain amount of the contact layer 28 is −13%·nm. The cladding layer 30, the contact layer 34 and the superlattice layer 36 have no strain. The etching stop layer 24 has a tensile strain and the strain amount of the etching stop layer 24 is −90%·nm.

According to the second embodiment, similarly to the first embodiment, the stress F2 caused by the tensile strain of the etching stop layer 24 compensates for the stress F1 caused by the temperature change. Therefore the stress remaining in the chip 20 is reduced, and the bonding strength between the chip 20 and the SOI wafer 10 is improved. Further, in the chip 20 after removal of the substrate 22 and the etching stop layers 24 and 26, the active layer 32 has a compressive strain, and the contact layer 28 has a tensile strain. Since the tensile strain of the contact layer 28 compensates for the compressive strain of the active layer 32, the entire strain of the chip 20 is 0%·nm. Therefore, the stress caused by the strains is suppressed as a whole and the reliability of the semiconductor device is improved.

Third Embodiment

A semiconductor device according to the third embodiment is a semiconductor device obtained by bonding the SOI wafer 10 to the chip 20 in the same manner as the semiconductor device shown in FIG. 1(a) and FIG. 1(b). A producing method is the same as the producing method shown in FIG. 2(a) to FIG. 7(b). Descriptions of the same components as those of the first embodiment will be omitted. A entire strain of the chip 20 of the third embodiment differs from the first and second embodiments. Table 3 shows the layered structure of the chip 20.

TABLE 3

| Layer | Material | Thickness | Strain [%] | Strain amount [%·nm] |
|---|---|---|---|---|
| Substrate 22 | InP | 350 μm | 0 | 0 |
| Etching stop layer 24 | i-GaInAs | 300 nm | −0.3 | −90 |
| Etching stop layer 26 | i-InP | 100 nm | 0 | 0 |
| Contact layer 28 | p-GaInAs | 100 nm | −0.07 | −7 |
| Cladding layer 30 | p-InP | 1800 nm | 0 | 0 |
| Active layer 32 | GaInAsP | well layer 32a: 5 nm × 5 | +1.0 | 13 |
|  |  | barrier layer 32b: 10 nm × 6 | −0.2 |  |
| Contact layer 34 | n-InP | 200 nm | 0 | 0 |
| Superlattice layer 36 | InP | 6 nm × 14 | 0 | 0 |
|  | GaInAsP | 7 nm × 14 | −0.06 | −5.88 |

As shown in Table 3, the strain amount of the active layer 32 is 13%·nm. The contact layer 28 has a tensile strain of −0.07%, a thickness of 100 nm, and a strain amount of −7%·nm. The thickness of the InP layer of the superlattice layer 36 is 6 nm, and the InP layer has no strain. The thickness of GaInAsP layer is 7 nm and has a tensile strain of −0.06%. The thickness of the superlattice layer 36 is 182 nm as a whole, and the strain amount is −5.88%·nm. The cladding layer 30 and the contact layer 34 have no strain. The etching stop layer 24 has a tensile strain, and the strain amount of the etching stop layer 24 is −90%·nm.

According to the third embodiment, similarly to the first embodiment, the stress F2 caused by the tensile strain of the etching stop layer 24 compensates for the stress F1 caused by the temperature change. Therefore the stress applied to the chip 20 is reduced, and the bonding strength between the chip 20 and the SOI wafer 10 is improved. Further, in the chip 20 after removal of the substrate 22 and the etching stop layers 24 and 26, the active layer 32 has a compressive strain, and the contact layer 28 and the superlattice layer 36 (second semiconductor layer) has a tensile strain. Since the tensile strains of the contact layer 28 and the superlattice layer 36 compensate for the compressive strain of the active layer 32, the strain of the chip 20 is 0.12%·nm. Therefore, the stress caused by the strains are suppressed as a whole and the reliability of the semiconductor device is improved.

In the first to third embodiments, the chip 20 may include a III-V group compound semiconductor other than the III-V group compound semiconductor shown in Tables 1-3. At least one of the layers remaining in the chip 20 after removing of the substrate 22 and the etching stop layers 24 and 26 has a tensile strain. For example, as shown in the Examples 1-3, at least one of the superlattice layer 36 and the contact layer 28 has a tensile strain. By applying a strain, a certain amount of crystal defects is generated within the superlattice layer 36 and the contact layer 28. The crystal defects are effective in promoting doping of impurities. Therefore, by applying the strain, the doping concentration of the impurities can be increased particularly in the contact layer 28, and the electric resistivity can be reduced. In order to improve the optical characteristics, a compressive strain is applied to the active layers 32. Since the tensile strain compensates for the compressive strain of the active layer 32, the strain amount of the chip 20 is reduced as a whole. Thus the stress applied to the chip 20 is reduced.

Although the embodiments of the present disclosure have been described above in detail, the present disclosure is not limited to the specific embodiments, and various modifications and variations are possible within the scope of the gist of the present disclosure described in the claims.

What is claimed is:

1. A method for producing a semiconductor device, the method comprising:
    a step of bonding a chip to a SOI (Silicon on Insulator) wafer, the chip being formed of a III-V group compound semiconductor and including a substrate and a first semiconductor layer by heating the chip and the SOI wafer to a first temperature;
    a step of cooling the chip and the SOI wafer to a second temperature lower than the first temperature after the step of bonding; and
    a step of removing the substrate and the first semiconductor layer from the chip after the step of cooling,
    wherein the first semiconductor layer has a tensile strain, and a thermal expansion coefficient of the substrate is larger than a thermal expansion coefficient of the SOI wafer.

2. The method for producing a semiconductor device according to claim 1, wherein:
    the chip further comprises an active layer and a second semiconductor layer;
    the active layer has a compressive strain and the second semiconductor layer has a tensile strain; and
    the active layer and the second semiconductor layer remain in the step of removing the substrate and the first semiconductor layer.

3. The method for producing a semiconductor device according to claim 1, wherein the substrate of the chip includes an indium phosphide.

4. The method for producing a semiconductor device according to claim 1, wherein the substrate has a thickness of 100 μm or more.

5. The method for producing a semiconductor device according to claim 1, wherein the first temperature is 100° C. or more, and the second temperature is 50° C. or less.

6. The method for producing a semiconductor device according to claim 1, wherein the step of removing the substrate and the first semiconductor layer comprises a step of etching the substrate, and the first semiconductor layer is an etching stop layer.

7. A semiconductor device comprising:
    a SOI (Silicon on Insulator) wafer, and
    a chip that is bonded to the SOI wafer, wherein
    the chip is formed of a III-V group compound semiconductor and includes a semiconductor layer having a tensile strain, and
    the chip further comprises an active layer which, as a whole, has a compressive strain.

8. The semiconductor device according to claim 7, wherein a sum of a product of a thickness and a strain of the semiconductor layer and a product of a thickness and a strain of the active layer is 0.5% nm or more and 0.5%·nm or less.

9. The semiconductor device according to claim 7, wherein the semiconductor layer having the tensile strain in the chip is at least one of a superlattice layer forming a bonding interface with the SOI wafer and a contact layer forming a surface of the chip.

* * * * *